United States Patent
Chu et al.

(10) Patent No.: US 7,208,399 B2
(45) Date of Patent: Apr. 24, 2007

(54) TRANSISTOR WITH NOTCHED GATE

(75) Inventors: Charles Chu, Portland, OR (US); Thomas A. Letson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/897,351

(22) Filed: Jul. 22, 2004

(65) Prior Publication Data

US 2004/0259340 A1 Dec. 23, 2004

Related U.S. Application Data

(62) Division of application No. 09/207,059, filed on Dec. 7, 1998, now abandoned.

(51) Int. Cl.
*H01L 21/3205* (2006.01)

(52) U.S. Cl. .................. 438/585; 257/E21.011

(58) Field of Classification Search ........... 438/182, 438/574, 579, 530, 299, 542, 197, 301, 585
See application file for complete search history.

(56) References Cited

U.S. PATENT DOCUMENTS

| | | | |
|---|---|---|---|
| 4,712,291 A * | 12/1987 | McLevige | 438/182 |
| 4,923,827 A * | 5/1990 | Calviello et al. | 438/574 |
| 4,929,567 A | 5/1990 | Park et al. | |
| 5,089,863 A | 2/1992 | Satoh et al. | |
| 5,472,564 A | 12/1995 | Nakamura et al. | |
| 5,834,817 A * | 11/1998 | Satoh et al. | 257/387 |
| 5,937,299 A * | 8/1999 | Michael et al. | 438/299 |
| 5,981,383 A | 11/1999 | Lur et al. | |
| 6,010,954 A | 1/2000 | Ho et al. | |
| 6,015,746 A * | 1/2000 | Yeh et al. | 438/421 |
| 6,037,200 A | 3/2000 | Uda et al. | |

FOREIGN PATENT DOCUMENTS

| JP | 54013711 | 2/1979 |
|---|---|---|
| JP | 63197646 | 8/1988 |

* cited by examiner

*Primary Examiner*—Scott B. Geyer
(74) *Attorney, Agent, or Firm*—Blakely, Sokoloff, Taylor & Zafman LLP

(57) ABSTRACT

A transistor having a gate electrode with a T-shaped cross section is fabricated from a single layer of conductive material using an etching process. A two process etch is performed to form side walls having a notched profile. The notches allow source and drain regions to be implanted in a substrate and thermally processed without creating excessive overlap capacitance with the gate electrode. The reduction of overlap capacitance increases the operating performance of the transistor, including drive current.

9 Claims, 4 Drawing Sheets

TRANSISTOR WITH NOTCHED GATE

CLAIM OF PRIORITY

This application is a divisional application of U.S. patent application Ser. No. 09/207,059 entitled "TRANSISTOR WITH NOTCHED GATE," filed on Dec. 7, 1998 now abandoned.

FIELD

Embodiments of the invention relate generally to the field of integrated circuit transistors and in particular the present invention relates to metal oxide semiconductor (MOS) transistor gates.

BACKGROUND

Integrated circuits transistors produced using a standard complementary metal-oxide-semiconductor (CMOS) integrated circuit fabrication process, such as MOS field-effect transistors (MOSFET), have source and drain regions, and a gate electrode. The MOSFETs are typically fabricated such that each have an n-type doped polysilicon gate electrode. The source and drain regions are typically implanted into a substrate of silicon. A channel region is defined between the source and drain regions and beneath the gate electrode. Because of overlap capacitance, gate overlap of the source and drain regions is not desired. This is, a capacitance is created between the gate and source/drain regions where an overlap exits. It is desired, therefore, to minimize this overlap.

Controlling the amount of overlap between the gate and source/drain is compounded by the need to anneal the implant regions of the source/drain to meet minimum depth requirements. One technique used to control the implant spacing between the source and drain uses spacers attached to side walls of the gate electrode. Additional fabrication steps are required to create these spacers.

For the reasons stated above, and for other reasons stated below which will become apparent to those skilled in the art upon reading and understanding the present specification, there is a need in the art for a transistor which has a reduced overlap capacitance while reducing the required processing steps.

BRIEF DESCRIPTION OF THE DRAWINGS

The invention may be best understood by referring to the following description and accompanying drawings that are used to illustrate embodiments of the invention. In the drawings.

DETAILED DESCRIPTION

Figure 1:
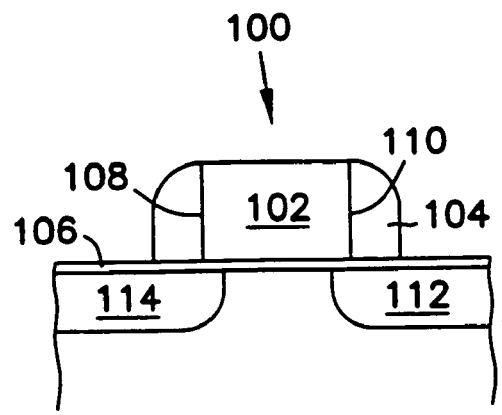
FIG. 1 illustrates a transistor formed with a straight profile gate electrode and oxide spacers.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

In the following detailed description of the invention, reference is made to the accompanying drawings which form a part hereof, and in which is shown, by way of illustration, specific embodiments in which the invention may be practice. In the drawings, like numerals describe substantially similar components throughout the several views. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The following detailed description is, therefore, not to be taken in a limiting sense, and the scope of the present invention is defined only by the appended claims, along with the full scope of equivalents to which such claims are entitled.

A transistor is described herein which has a gate electrode with a "notched" profile. The notch is formed above both source and drain regions to control the location of an initial implant of source and drain extension regions. The notched polysilicon gate electrode enables an offset of the extension from the edge of the gate polysilicon to gate oxide junction. The offset provides enough lateral diffusion distance to perform an anneal operation without resulting in unwanted lateral diffusion under the gate electrode.

To more fully understand the notched gate electrode described herein, reference is made to FIG. 1 illustrating a transistor 100 formed with a straight profile gate electrode 102 and oxide spacers 104. First a gate oxide layer 106 is formed on a substrate, and then a layer of gate polysilicon is deposited, masked and etched to form an electrode 102. It is noted that the lateral edges 108 and 110 of the gate polysilicon are straight. A layer of oxide is then fabricated over the gate polysilicon. The oxide is patterned and etched to form spacers 104 attached to the straight edges of the gate polysilicon. Source and drain regions 112 and 114 are then formed into the substrate using the oxide spacers to define a lateral distance between the junctions, or doped regions. An anneal operation is then performed to further vertically diffuse the source/drain regions. The annealing operation also results in lateral diffusion of the dopants under the gate polysilicon. It will be appreciated that the variables experienced in depositing, masking and etching the oxide spacers results in a variable distance between the edges of the spacers and the polysilicon edge. The lateral diffusion of the extension regions, therefore, often results in an uncontrolled overlap with the gate electrode. This overlap results in degraded performance by creating an overlap capacitance. In addition, the extra processing steps of forming the oxide spacers are not desired.

Figure 2:
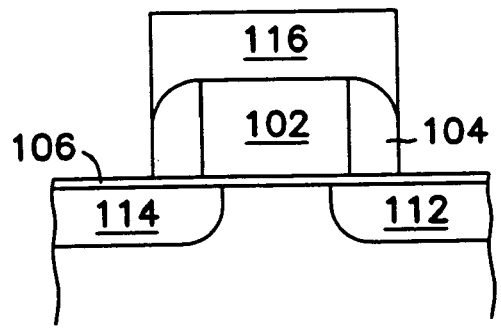
FIG. 2 illustrates a "T-shaped" gate electrode formed from multiple layers of material.

A transistor having an alternate gate electrode is illustrated in FIG. 2. The gate electrode cross section approximates a "T". That is, the top of the gate electrode is wider than the base. The transistor gate is not formed form the single layer of conductive material, but requires the deposition, patterning and etching of a second polysilicon layer 116. This transistor provides a larger interconnect conductor, but requires the multi-process steps of forming the oxide spacers and the additional gate polysilicon deposition, pattern and etch to form the top of the electrode.

Figure 3:
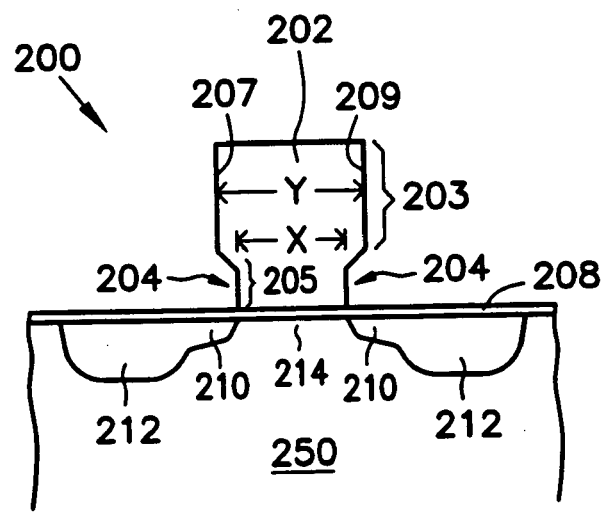
FIG. 3 is a cross section view of an integrated circuit transistor.

To reduce overlap capacitance, while minimizing process steps, a notched gate electrode is described herein which is formed from a single layer of conductive material. Referring to FIG. 3, a cross section of a fabricated integrated circuit transistor 200 is illustrated and described. The transistor includes a gate electrode 202 fabricated with notches 204. The gate electrode is separated from a substrate 250 by a layer of gate oxide 208. Source and drain regions 212 are formed (such as by ion implanting) into the substrate. The source and drain regions include extension regions 210. The area between the extension regions, and beneath the gate electrode, is referred to as the transistor body, or channel region 214. It will be appreciated by those skilled in the art that the notches 204 allow the diffusion of the extension regions to be a controlled distance from a vertical surface of the notch. That is, the depth of the notches defines a lateral diffusion distance which can be used during an annealing step without creating an horizontal overlap between the bottom of the gate electrode and the source/drain regions, as explained below. It will be appreciated by those skilled in the art, that the transistor illustrated in FIG. 3 is not complete and that electrical contacts to the source, drain and gate are required. To focus on the present invention, these, and other optional features, have not been illustrated.

The gate electrode 202 is formed from a single layer and has a top region 203, a bottom region 205, a first vertical side wall 207 and a second opposite-vertical side wall 209. The first and second vertical side walls have a stepped surface such that a first lateral distance Y between the first and second vertical side walls at the top region is greater than a second lateral distance X between the first and second vertical side walls at the bottom region. In one embodiment, distance Y is approximately 20 nano meters larger than distance X. It will be appreciated that the difference between Y and X can vary over a wider range, including but not limited to 10 to 40 nano meters. The transistor has a general T-shaped gate in a cross section view which intersects the source and drain regions.

Figure 4A:
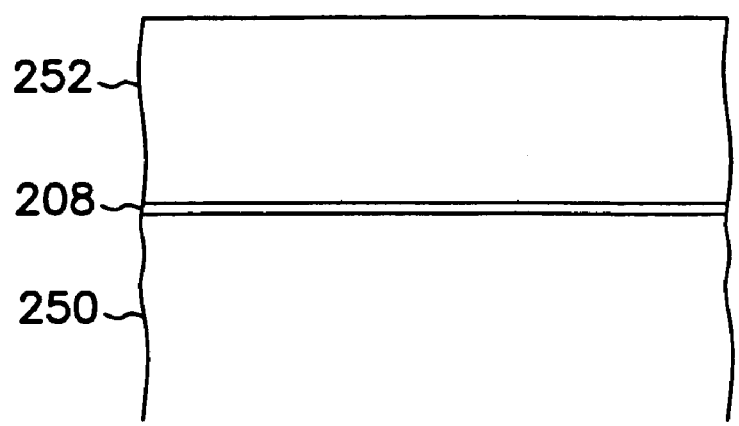
FIGS. 4(a)–(f) illustrate one method of fabricating the transistor of FIG. 3.
Figure 4B:
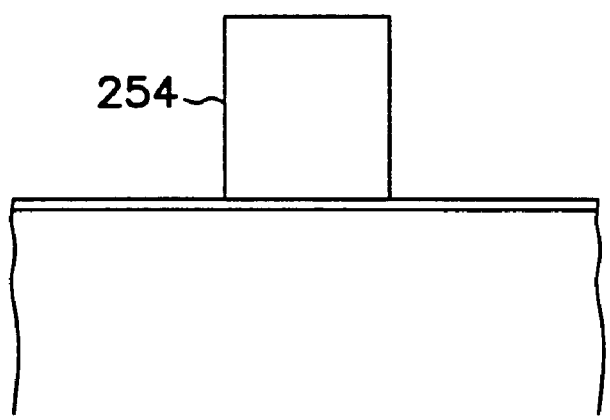
Figure 4C:
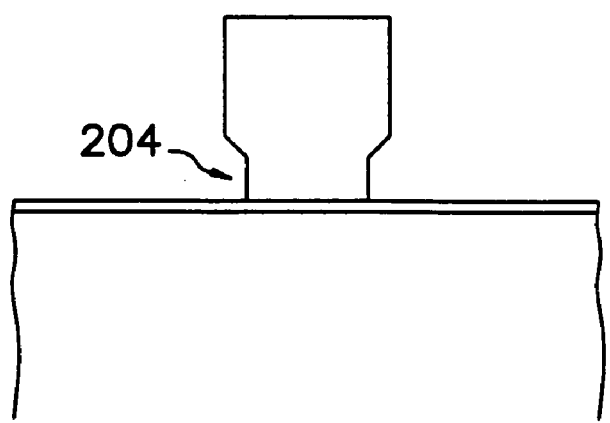

A description of one method of fabricating a transistor having a notched gate electrode is provided as follows, with reference to FIGS. 4(a)–(f). FIG. 4(a) illustrates a cross-section of a semiconductor substrate 250, a layer of gate oxide 208 and a layer of material, such as doped polysilicon 252. It will be appreciated that the substrate in the region of the transistor can be isolated from adjacent circuits and doped accordingly for the type of transistor desired, as know in the art. The polysilicon layer 252 is masked and bulk etched to define the upper edges and the vertical side walls of the gate electrode 254, as shown in FIG. 4(b). Once the gate oxide layer is reached, a selective etch is performed to create the notches 204 on the bottom edges of the gate electrode, see FIG. 4(c). The second etch process is highly selective and does not remove much gate oxide 208. As such, there is no breakthrough of the gate oxide. The selective etch removes passivation at the polysilicon to gate oxide corner, and allows lateral etching of the polysilicon gate electrode to create the notches 204. During the selective etch process, the lateral etch rate approaches saturation to enable uniform control of the lateral undercut. Thus, the formation of the notches is close to self limiting. The selective etch is performed with the bulk polysilicon etch process, but can be considered a separate step because the etch control parameters are changed. The selective etch is a low pressure, high power etch which has a duration approximately equal to the duration of the bulk polysilicon etch, in the range of about 20 to 40 seconds.

In one embodiment, the selective etch is performed using a commercially available Hitachi M511 plasma etcher. The process is performed using the settings shown in Table 1.

TABLE 1

| Parameter | Units | Breakthrough Etch | Bulk Etch | Over Etch 1 | Over Etch 2 |
|---|---|---|---|---|---|
| TCR temp | deg C. | 5 | 5 | 5 | 5 |
| EL height | mm | 80 | 80 | 80 | 80 |
| Pressure | Pa | 0.4 | 0.4 | 0.4 | 1.2 |
| RF Power | W | 60 | 25 | 20 | 25 |
| uW Power | W | 400 | 400 | 400 | 400 |
| Gas A, Cl | ccm | 25 | 25 | 25 | 0 |
| Gas B, $O_2$ | ccm | 3 | 3 | 3 | 5 |
| Gas C, HBr | ccm | 75 | 75 | 75 | 100 |
| Coil 1 | A | 14 | 14 | 14 | 14 |
| Coil 2 | A | 17 | 17 | 17 | 14 |
| Coil 3 | A | 3 | 3 | 3 | 3 |
| Time | sec | 5 | EP | 24 | 12 |
| He Backside | kPa | 1 | 1 | 1 | 1 |
| Cont Plasma | y/n | n | y | y | n |

The process uses a first etch, or Break through etch, to remove surface oxide. The bulk etch removes polysilicon to the gate oxide layer. The end point (EP) of this etch is based on measuring gas chemistry in the etch chamber to physically determine when all the polysilicon has been removed. The over etch 1 step straightens the polysilicon profile to forms the final profile with the above defined notches. An operational over etch 2 process can be used to remove any residual of polysilicon remaining after the over etch 1 step.

Figure 4D:
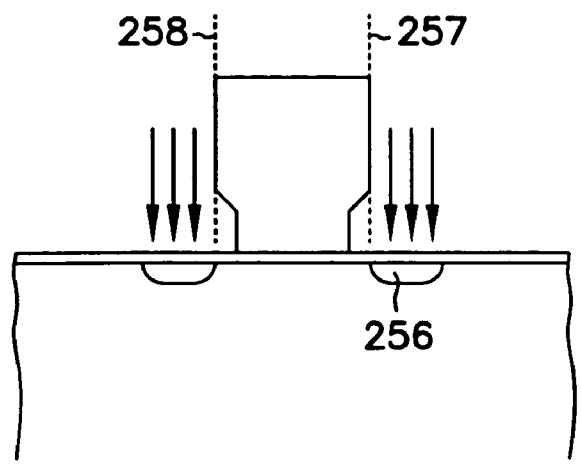
Figure 4E:
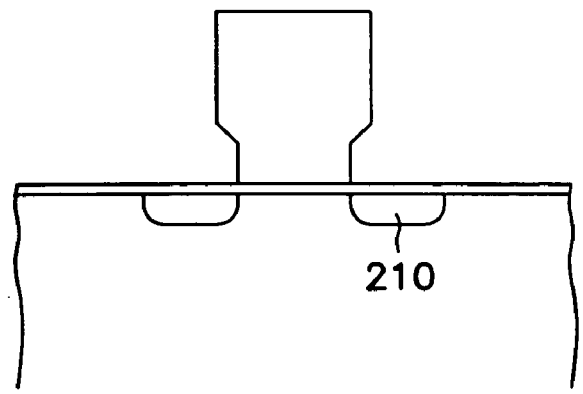

Referring to FIG. 4(d), after the notched profile of the polysilicon gate is formed, a shallow implant operation is performed to form the extension regions of the source and drain. The implant 256 is spaced laterally from the bottom of the gate electrode. That is, the top of the gate electrode patterns the shallow implant regions 256 by defining lateral boundaries so that the implant regions 256 do not extend under the gate. The implant regions 256, therefore, do not substantially extend under the gate, and beyond vertical planes 257 and 258 defined by the side wall surfaces of the top region 203 of the gate electrode.

Figure 4F:
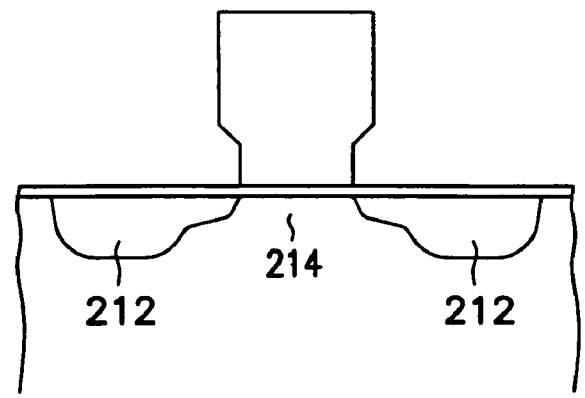

The extension regions of the source and drain must vertically extend into the substrate a minimum depth to reduce current spreading resistance. Thus, the shallow implant is thermally processed, or annealed, to further diffuse the implant vertically, FIG. 4(e). The anneal operation also laterally diffuses the implant regions. By controlling the anneal operation, the lateral diffusion distance can be tailored to match the notch depth. As such, overlap between the gate electrode and the source/drain regions is reduced. After the thermal processing, the source and drain regions 210 extend under the gate electrode beyond the vertical planes 257 and 258. The source and drain regions 210, however, do not appreciably extend under the gate electrode beyond vertical planes defined by the interior surface of the notches 204. Finally, a deep implant is performed to form the full source and drain regions 212 as shown in FIG. 4(f), which also shows the channel region 214. It will be appreciated that the deep implant is performed to provide low resistance contacts. Doping of the elements and regions of the transistor is considered well known in the art, and is not discussed further herein.

Figure 5:
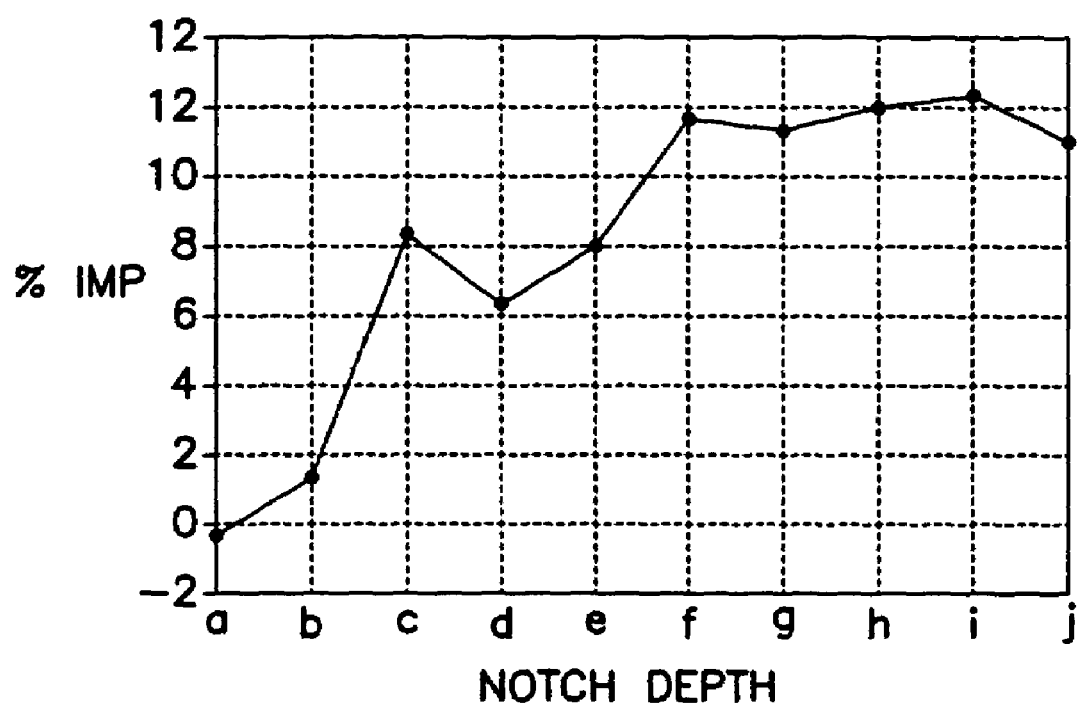
FIG. 5 is a graph of transistor drain current versus over etch.

Several benefits are provided by fabricating transistor gate electrodes with a notched profile. The first benefit is provided in patterning the polysilicon layer. As transistor dimensions reduce, patterning the process layers becomes more difficult. The present transistor gate allows the polysilicon to be patterned using the larger area of the top of the gate electrode, while providing a smaller gate oxide interface area. Second, the overlap capacitance of the transistor is reduced, as explained above. FIG. 5 is a graph of transistor circuit performance versus over etch depth. The graph illustrates the percent improvement (increase) in oscillation frequency of a ring oscillator using notched transistors. The notch depths were created using increased etch times. The first sample (a) did not contain notches, while the remaining samples had increasing notch depths. Sample (e) had a depth of approximately 15–20 nm, and sample (I) had a depth of approximately 20–25 nm. A ring oscillator was used to illustrate the performance increase attributed to the reduced capacitance of the transistors, with other variable remaining constant. It can be seen that as the depth of the notches increase, the oscillator performance also increases. This performance increase has limitations, and will plateau or decrease as the notch depth continues to increase. Thus, the performance of the last sample (j) begins to decrease due to an increased resistance between the extension regions which do not fully reach the gate polysilicon (negative over lap).

A method of reducing overlap capacitance in an integrated circuit transistor has been described herein. The method comprises forming a transistor gate electrode, having a T-shaped cross section, from a single layer of material using an etching process. In one embodiment, a two process etch is performed to form side walls having a notched profile. The notches allow source and drain regions to be implanted and thermally processed without creating excessive overlap capacitance. The reduction of overlap capacitance increases the operating performance of the transistor.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method of fabricating an integrated circuit transistor, the method comprising:
    fabricating a single layer of conductive material;
    performing a first etch of the conductive material to define first and second opposite vertical side walls of a gate electrode; and
    performing a second etch of the conductive material to form recess regions in the first and second opposite vertical side walls, the recess regions are located at a bottom of the first and second opposite vertical side walls so that a cross-section of the gate electrode generally approximates a T-shape.

2. The method of claim 1 further comprising:
    implanting source and drain regions in substrate which is located below the layer of conductive material, a top of the gate electrode defining lateral boundaries of the source and drain regions so that the source and drain regions are not implanted under the gate electrode.

3. The method of claim 2 further comprising:
    thermally processing the source and drain regions to laterally diffuse the source and drain regions under the recess regions of the gate electrode.

4. The method of claim 3 wherein the first etch removes the conductive material to expose a layer of underlaying oxide.

5. The method of claim 3 further comprises performing a third etch to remove residual conductive material remaining after the second etch.

6. The method of claim 1 wherein the recess regions have a lateral depth in the range of 5 to 20 nano meters.

7. A method of reducing overlap capacitance in an integrated circuit transistor, the method comprising:
    forming a transistor gate electrode from a single layer of conductive material using an etching process, the gate electrode having a T-shaped cross section, wherein the etching process includes a first etch of the conductive material to define first and second opposite vertical side walls of a gate electrode and a second etch of the conductive material to form recess regions in the first and second opposite vertical side walls;
    implanting source and drain regions in a substrate which is located below the gate electrode, a top of the gate electrode defining lateral boundaries of the source and drain regions so that the source and drain regions are not implanted under the gate electrode; and
    thermally processing the implanted source and drain regions to laterally diffuse the source and drain regions under the recess of the gate electrode.

8. The method of claim 7 wherein the gate electrode has a bottom cross section width that is approximately 20 nano meters less than a top cross section width.

9. The method of claim 7 wherein the single layer of conductive material is polysilicon.

* * * * *